(12) United States Patent
Hoshina

(10) Patent No.: US 6,897,933 B2
(45) Date of Patent: May 24, 2005

(54) SUBSTRATE TERMINAL STRUCTURE, LIQUID-CRYSTAL DEVICE AND ELECTRONIC APPARATUS

(75) Inventor: Kazushige Hoshina, Matsumoto (JP)

(73) Assignee: Seiko Epson Corporation (JP)

( * ) Notice: Subject to any disclaimer, the term of this patent is extended or adjusted under 35 U.S.C. 154(b) by 94 days.

(21) Appl. No.: 10/096,322

(22) Filed: Mar. 12, 2002

(65) Prior Publication Data

US 2002/0145697 A1 Oct. 10, 2002

(30) Foreign Application Priority Data

Mar. 14, 2001 (JP) .......................................... 2001-072268

(51) Int. Cl.[7] .......................................... G02F 1/1345
(52) U.S. Cl. ........................ 349/152; 349/149; 349/151
(58) Field of Search ................................. 349/149–152

(56) References Cited

U.S. PATENT DOCUMENTS

| | | | | |
|---|---|---|---|---|
| 4,655,551 A | * | 4/1987 | Washizuka et al. ......... | 349/150 |
| 5,668,700 A | * | 9/1997 | Tagusa et al. ............... | 361/779 |
| 6,358,065 B1 | * | 3/2002 | Terao et al. .................. | 439/67 |
| 6,501,525 B2 | * | 12/2002 | Huang et al. ............... | 349/150 |
| 6,542,213 B1 | * | 4/2003 | Uchiyama ................... | 349/149 |

* cited by examiner

*Primary Examiner*—Tarifur R. Chowdhury
*Assistant Examiner*—Richard Kim
(74) *Attorney, Agent, or Firm*—Harness, Dickey & Pierce, P.L.C.

(57) ABSTRACT

A wiring substrate 7 is attached by pressure to a substrate overhang with an ACF 6b, and substrate terminals 21 formed on the substrate overhang 2c from ITO and the first terminals 21 formed on the rear surface of wiring substrate 7 are electrically connected. The wiring substrate 7 has second terminals 27 on its surface and these second terminals 27 are electrically connected to the first terminals located on the rear surface via a throughhole. The wiring pattern on the wiring substrate 7 is formed from a material with an electric resistance lower than that of the ITO forming the substrate terminals 21, which makes it possible to hold the resistance of the wiring on the substrate overhang 2c to a low value.

18 Claims, 11 Drawing Sheets

FIG. 4
(a) External connection side
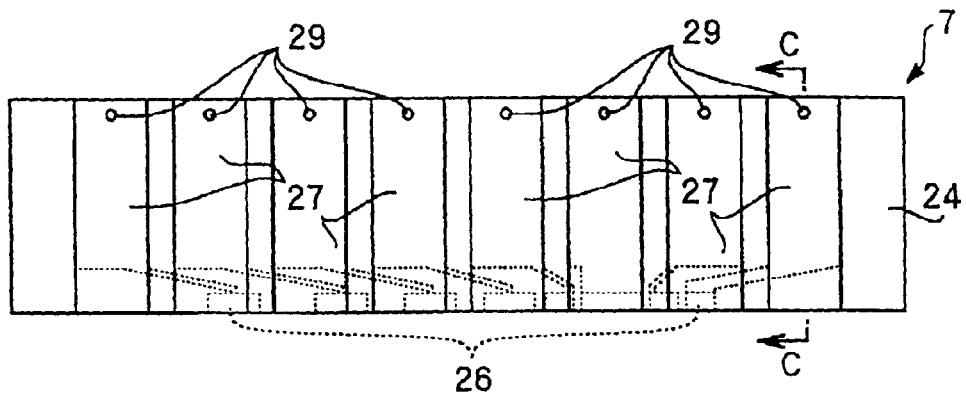
(b) Liquid-crystal panel side
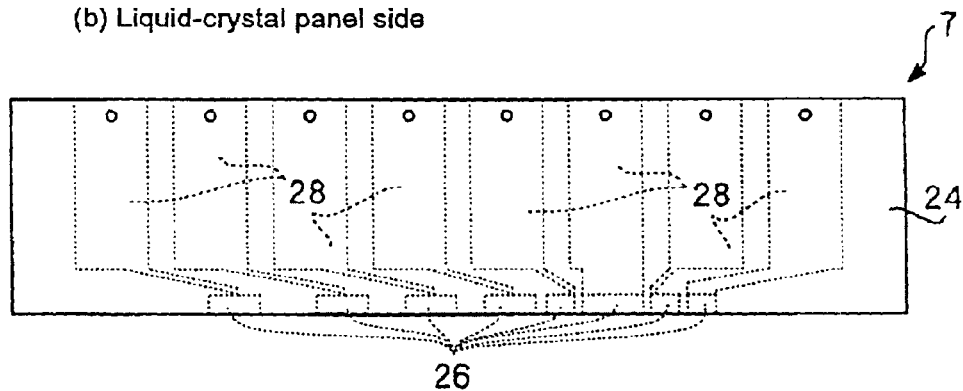
(c)
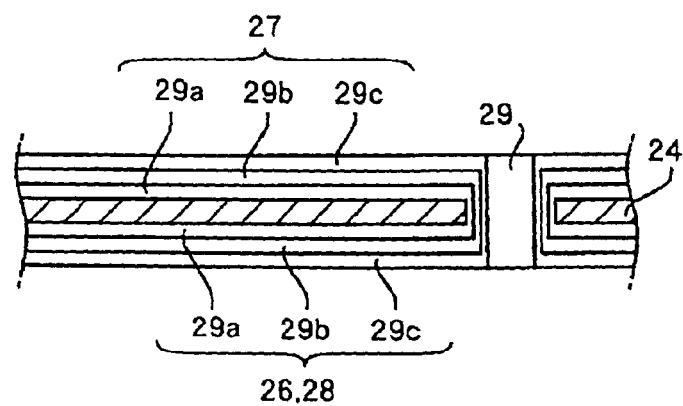

10

SUBSTRATE TERMINAL STRUCTURE, LIQUID-CRYSTAL DEVICE AND ELECTRONIC APPARATUS

BACKGROUND OF THE INVENTION

1. Field of the Invention

The present invention relates to the terminal structure of a wiring pattern formed on a substrate. Furthermore, the present invention relates to a liquid-crystal device using such a terminal structure. Moreover, the present invention relates to an electronic apparatus using such a liquid-crystal device.

2. Prior Art

In recent years, liquid-crystal devices have been widely used as displays for a variety of electronic apparatus such as cellular phones, portable electronic terminals, and the like. In liquid-crystal devices, an image, such as a letter, a numeral, or the like is displayed on the surface of a substrate by modulating, in each pixel, the light that passes through a liquid-crystal layer sandwiched between this substrate and another substrate.

A liquid-crystal device, for example, as shown in FIG. 10 where the entire device is denoted by the reference symbol 101, is formed by pasting a first substrate 102a and a second substrate 102b to each other with a frame-like sealing material 103 provided between the two substrates, and then injecting liquid crystals between these substrates. Furthermore, the first substrate 102a has a substrate overhang 102c which projects to the outside of the second substrate 102b, and a wiring pattern 104 extending from a display region V together with a terminal 106 for external connection, which is connected to an external circuit (not shown in the figure), are formed on the substrate overhang 102c.

An IC 107 for liquid crystal drive is directly mounted on the substrate overhang 102c, thereby composing a mount structure of the so-called COG (Chip On Glass) type.

The input bumps of the IC 107 for liquid crystal drive are electrically connected to the terminals 106 for external connection. On the other hand, the output bumps of IC 107 are electrically connected to the wiring pattern 104. The wiring pattern 104 and terminals 106 for external connection are formed simultaneously during the formation of electrodes which are formed on substrates 102a and 102b in the display region V. These electrodes are usually formed from a metal oxide, for example, ITO (Indium Tin Oxide). Therefore, the wiring pattern 104 and terminals 106 for external connection can also be formed from ITO or the like.

FIG. 11 is an expanded view of the wiring pattern 104 and terminals 106 for external connection in the portion of the liquid-crystal device 101, shown in FIG. 10, where the IC 107 for liquid crystal drive is mounted. In FIG. 11, the terminals 106 for external connection are the components providing electric connection to the external circuit with an electrically conductive connecting element such as a rubber connector or a spring connector, and therefore the width W, thereof, must be sufficiently large.

By contrast, since multiple terminals 108, which are electrically connected to the bumps of IC 107 for liquid crystal drive, are arranged at a very narrow pitch, the width of the wiring pattern 109 connecting the terminals 108 and the terminals 106 for external connection must necessarily be very small. This becomes even more apparent as the number of terminals 106 for external connection or terminals 108 increases.

ITO, which forms the wiring pattern 109, is a material with a high electric resistance, and if the width of wiring pattern 109 is decreased, its electric resistance becomes extremely high, sometimes reaching, for example, 800 Ω. There is the possibility that such an increase in the electric resistance of wiring pattern 109 will cause various lighting defects such as an overall decrease in display density and the appearance of the so-called cross-talk effect; that is, a cobwebbing phenomenon manifesting itself as the formation of unwanted black lines in the lateral direction of the display screen.

The present invention was created to resolve the above-described problems and it is an object of the present invention to prevent the increase in the electric resistance of the wiring formed on a substrate even when the density of the wiring is increased.

SUMMARY OF THE INVENTION (1) In order to attain the above-described object, the present invention provides a substrate terminal structure comprising a substrate, substrate terminals formed on the aforementioned substrate from a metal oxide film, and a wiring substrate adhesively bonded to the aforementioned substrate; wherein the aforementioned wiring substrate comprises first terminals connected to the aforementioned substrate terminals, a wiring pattern extending from said first terminals, and second terminals extending from said wiring pattern, and the aforementioned wiring pattern has an electric resistance lower than that of the aforementioned metal oxide film.

With the substrate terminal structure of such configuration, the wiring pattern, connecting the substrate terminals formed on the substrate by a metal oxide film to the second terminals connected to the external circuit, is formed by a wiring pattern with a small electric resistance on a wiring substrate, rather than by the metal oxide film. Therefore, an increase in the electric resistance of the wiring pattern can be prevented even when the wiring density of the wiring pattern is increased and the line width of the wiring pattern is decreased.

Moreover, in order to prevent an increase in the electric resistance of the wiring pattern in the substrate terminal structure of the aforementioned configuration, it is sufficient that only the wiring pattern be formed from a material with an electric resistance lower than that of the metal oxide. However, it is preferable that the aforementioned first and second terminals also be formed from the same material as the aforementioned wiring pattern. In this case, the first terminals, second terminals, and wiring pattern can be easily formed on said wiring substrate.

Furthermore, it is also preferable that the wiring pattern in the substrate terminal structure of the aforementioned configuration be formed from a material containing Cu. More specifically, the preferred wiring pattern will be formed from Cu by using a patterning process, such as photolithography, on a base material formed from a polyimide or the like, and then a Ni (nickel) layer and a Au (gold) layer will be deposited by means of plating on the wiring pattern. If a flexible material such as a polyimide is used as the base material, a so-called FPC (Flexible Printed Circuit) can be composed.

Furthermore, it is preferable that a so-called two-surface wiring substrate having wiring patterns on both surfaces be used as the wiring substrate in the substrate terminal structure of the aforementioned configuration. In this case, it is further preferred that the aforementioned first terminals be formed on one surface of the aforementioned two-surface wiring substrate and the aforementioned second terminals be formed on the opposite surface of the aforementioned two-surface wiring substrate. As a result, the wiring pattern formation region can be made much larger than in the configuration in which the first terminals, second terminals, and wiring pattern are formed only on one side of the wiring substrate.

Moreover, it is preferable that in the aforementioned substrate terminal structure using a two-surface wiring substrate as the wiring substrate, the aforementioned second terminals be formed so as to be longer than the aforementioned first terminals. The second terminals are connected to an external circuit; the connection in this case is implemented, for example, with a rubber connector or spring connector. Since there may be variations in the contact positions of the rubber connector and second substrate caused by variations during the assembly process, increasing the areas of the second terminals by making them longer than the first terminals can provide reliable contact even when there are variations in the contact positions between the rubber connectors.

(2) Furthermore, the first liquid-crystal device related to the present invention comprises a pair of substrates sandwiching liquid crystals, substrate terminals formed from a metal oxide film on a substrate overhang, which projects from at least one of said substrates to the outside of the other substrate, and a wiring substrate adhesively bonded to the aforementioned substrate overhang; wherein the aforementioned wiring substrate comprises first terminals connected to the aforementioned substrate terminals, a wiring pattern extending from said first terminal, and second terminals extending from said wiring pattern, and the aforementioned wiring pattern has an electric resistance lower than that of the aforementioned metal oxide film.

Furthermore, the second liquid-crystal device related to the present invention comprises a pair of substrates sandwiching liquid crystals, an electronic component mounted on a substrate overhang, which projects from at least one of said substrates to the outside of the other substrate, substrate terminals provided on the aforementioned substrate overhang, connected to the terminals of the aforementioned electronic component and formed from a metal oxide, and a wiring substrate adhesively bonded to the aforementioned substrate overhang; wherein the aforementioned wiring substrate comprises first terminals connected to the aforementioned substrate terminals, a wiring pattern extending from the first terminal, and second terminals extending from said wiring pattern; and the aforementioned wiring pattern has an electric resistance lower than that of the aforementioned metal oxide film.

In the aforementioned first and second liquid-crystal devices, the wiring pattern, connecting the substrate terminals formed from a metal oxide film on the substrate to the second terminals connected to an external circuit, is formed by a wiring pattern with a small electric resistance on a wiring substrate, rather than by a metal oxide film. Therefore, an increase in the electric resistance of the wiring pattern can be prevented even when the wiring density of the wiring pattern is increased and the line width of the wiring pattern is decreased.

The aforementioned second liquid-crystal device includes liquid-crystal devices of the COG type having a structure in which an electronic component is mounted on the substrate overhang. The aforementioned first liquid-crystal device includes liquid-crystal devices having a structure in which no electronic component is mounted on the substrate overhang.

In the aforementioned second liquid-crystal device, the aforementioned electronic component can be an IC chip. In this case, the aforementioned wiring substrate can be provided on the input terminal side of said IC chip.

Furthermore, in order to prevent an increase in electric resistance of the wiring pattern in the aforementioned first and second liquid-crystal devices, it is sufficient that only the wiring pattern be formed from a material with an electric resistance lower than that of the metal oxide. However, it is preferable that the aforementioned first terminals second terminals also be formed from the same material as the aforementioned wiring pattern. In such a case, the first terminals, second terminals, and wiring pattern can be easily formed on the aforementioned wiring substrate.

Furthermore, it is also preferable that the wiring pattern in the aforementioned first and second liquid-crystal devices be formed from a material containing Cu. More specifically, the preferred wiring pattern will be formed from Cu by using a patterning process, such as photolithography, on a base material formed from a polyimide or the like, and then a Ni (nickel) layer and a Au (gold) layer will be deposited by means of plating on the wiring pattern. If a flexible material such as a polyimide is used as the base material, a so-called FPC (Flexible Printed Circuit) can be composed.

Furthermore, it is preferable that a so-called two-surface wiring substrate having wiring patterns on both surfaces be used as the aforementioned wiring substrate in the aforementioned first and second liquid-crystal devices. In such a case, it is further preferred that the aforementioned first terminals be formed on one surface of the aforementioned two-surface wiring substrate and the aforementioned second terminals be formed on the opposite surface of the aforementioned two-surface wiring substrate. As a result, the wiring pattern formation region can be made much larger than the configuration in which the first terminals, second terminals, and wiring pattern are formed on only one side of the wiring substrate.

Moreover, it is preferable that in the aforementioned substrate terminal structure using a two-surface wiring substrate as the wiring substrate, the aforementioned second terminals be formed so as to be longer than the aforementioned first terminals. The second terminals are connected to an external circuit, and the connection in this case is implemented, for example, with a rubber connector or spring connector. Since there may be variations in the contact positions of the rubber connector and second terminals caused by variations during the assembly process, increasing the areas of the second terminals by forming them to be longer than the first terminals can provide reliable contact even when there are variations in the contact positions between the rubber connectors.

(3) The first electronic apparatus related to the present invention comprises a liquid-crystal device, a circuit substrate, and an electrically conductive connecting element, which electrically connects the aforementioned liquid-crystal device to the aforementioned circuit substrate. The aforementioned liquid-crystal device comprises a pair of substrates sandwiching liquid crystals, substrate terminals formed from a metal oxide film on a substrate overhang, which projects from at least one of said substrates to the outside of the other substrate, and a wiring substrate adhesively bonded to the aforementioned substrate overhang. The aforementioned wiring substrate comprises first terminals connected to the aforementioned substrate terminals, a wiring pattern extending from said first terminals, and second terminals extending from said wiring pattern; the aforementioned wiring pattern has an electric resistance lower than that of the aforementioned metal oxide film; and the aforementioned electrically conductive connecting element electrically connects the aforementioned second terminals located on the aforementioned wiring substrate to the aforementioned circuit substrate.

The second electronic apparatus related to the present invention comprises a liquid-crystal device, a circuit substrate, and an electrically conductive connecting element, which electrically connects the aforementioned liquid-crystal device to the aforementioned circuit substrate. The liquid-crystal device comprises a pair of substrates sandwiching liquid crystals, an electronic component mounted on a substrate overhang, which projects from at least one of said substrates to the outside of the other substrate, substrate terminals provided on the aforementioned substrate overhang, connected to the terminals of the aforementioned electronic component and formed by a metal oxide, and a wiring substrate adhesively bonded to the substrate overhang. The wiring substrate comprises first terminals connected to the aforementioned substrate terminals, a wiring pattern extending from said first terminal, and second terminals extending from said wiring pattern, the aforementioned wiring pattern has an electric resistance lower than that of the aforementioned metal oxide film, and the aforementioned electrically conductive connecting element electrically connects the aforementioned second terminals located on the aforementioned wiring substrate to the aforementioned circuit substrate.

In the substrate terminal structure contained inside the aforementioned first and second electronic apparatuses, the wiring pattern, connecting the substrate terminals formed on the substrate by a metal oxide film to the second terminals connected to the external circuit, is formed by a wiring pattern with a small electric resistance on a wiring substrate, rather than by the metal oxide film. Therefore, an increase in the electric resistance of the wiring pattern can be prevented even when the wiring density of the wiring pattern is increased and the line width of the wiring pattern is decreased.

The liquid-crystal device contained in the aforementioned second electronic apparatus includes liquid-crystal devices of the COG type having a structure in which an electronic component is mounted on the substrate overhang. The liquid-crystal device contained in the aforementioned first electronic apparatus includes liquid-crystal devices having a structure in which no electronic component is mounted on the substrate overhang.

BRIEF DESCRIPTION OF THE DRAWINGS

FIG. 4 illustrates a wiring pattern structure on the front and rear surfaces of the wiring substrate, which is the main structural component of the liquid-crystal device shown in FIG. 1.

DETAILED DESCRIPTION OF THE PREFERRED EMBODIMENTS OF THE INVENTION (First Embodiment)

Figure 1:
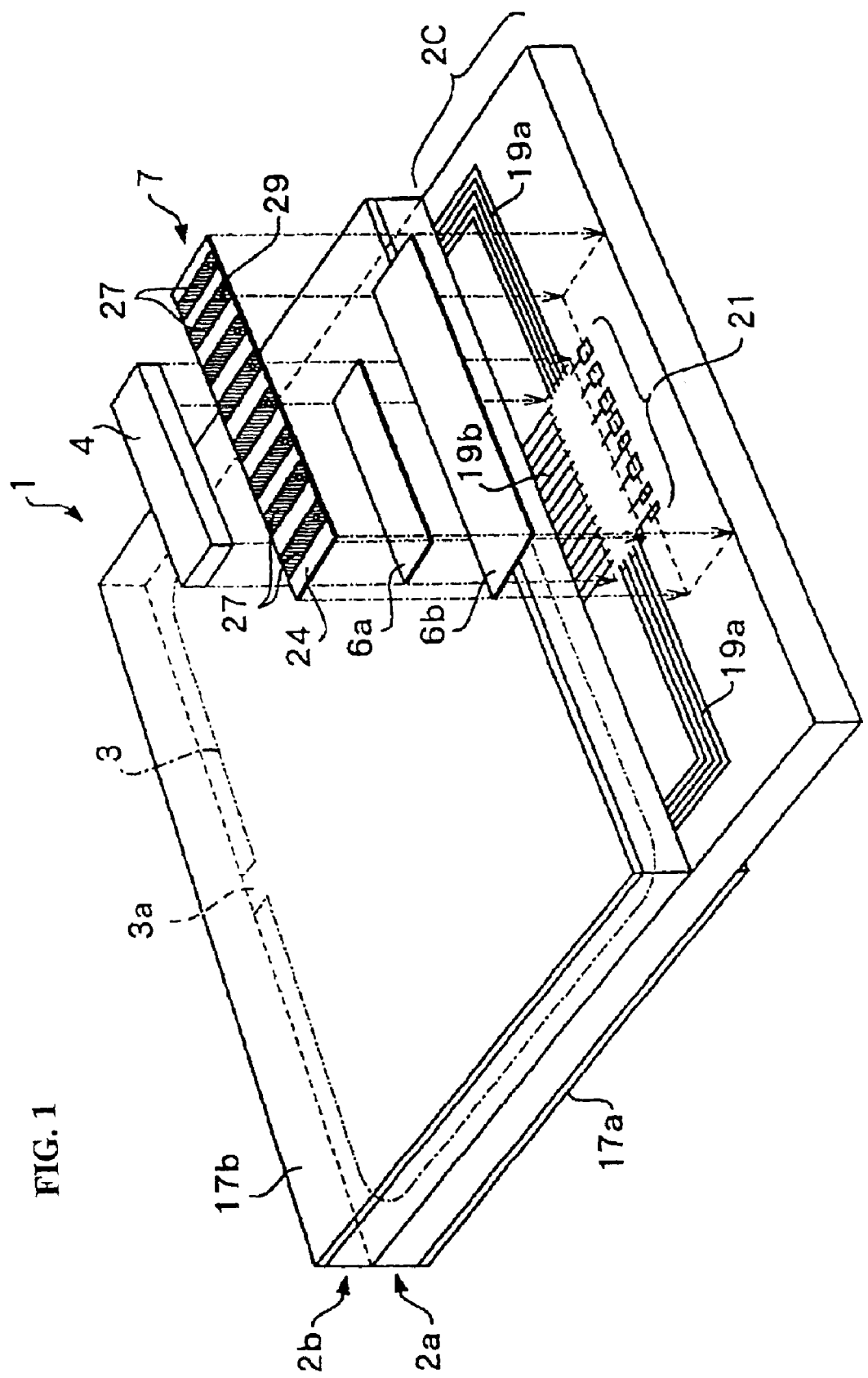
FIG. 1 is a perspective view illustrating the embodiments of the substrate terminal structure and the liquid-crystal device related to the present invention in its disassembled state thereof.

The substrate terminal structure related to the present invention will be described below with reference to a case in which it is used as the internal structure of a liquid-crystal device. FIG. 1 illustrates the preferred embodiment of the substrate terminal structure related to the present invention and a preferred embodiment of the liquid-crystal device related to the present invention.

The liquid-crystal device 1 shown in FIG. 1 is formed by adhesively bonding a first substrate 2a and a second substrate 2b with a frame-like sealing material 3 on the periphery of the substrates. The first substrate 2a has a substrate overhang 2c, which projects to the outside of the second substrate 2b. An IC4 for liquid crystal drive serving as an electronic component is mounted using an ACF (Anisotropic Conductive Film) 6a on the substrate overhang 2c, and a wiring substrate 7 is mounted using an ACF 6b. The wiring substrate 7 has second terminals 27 on its surface, and the second terminals 27 are used for electric connection to the external components.

Figure 7:
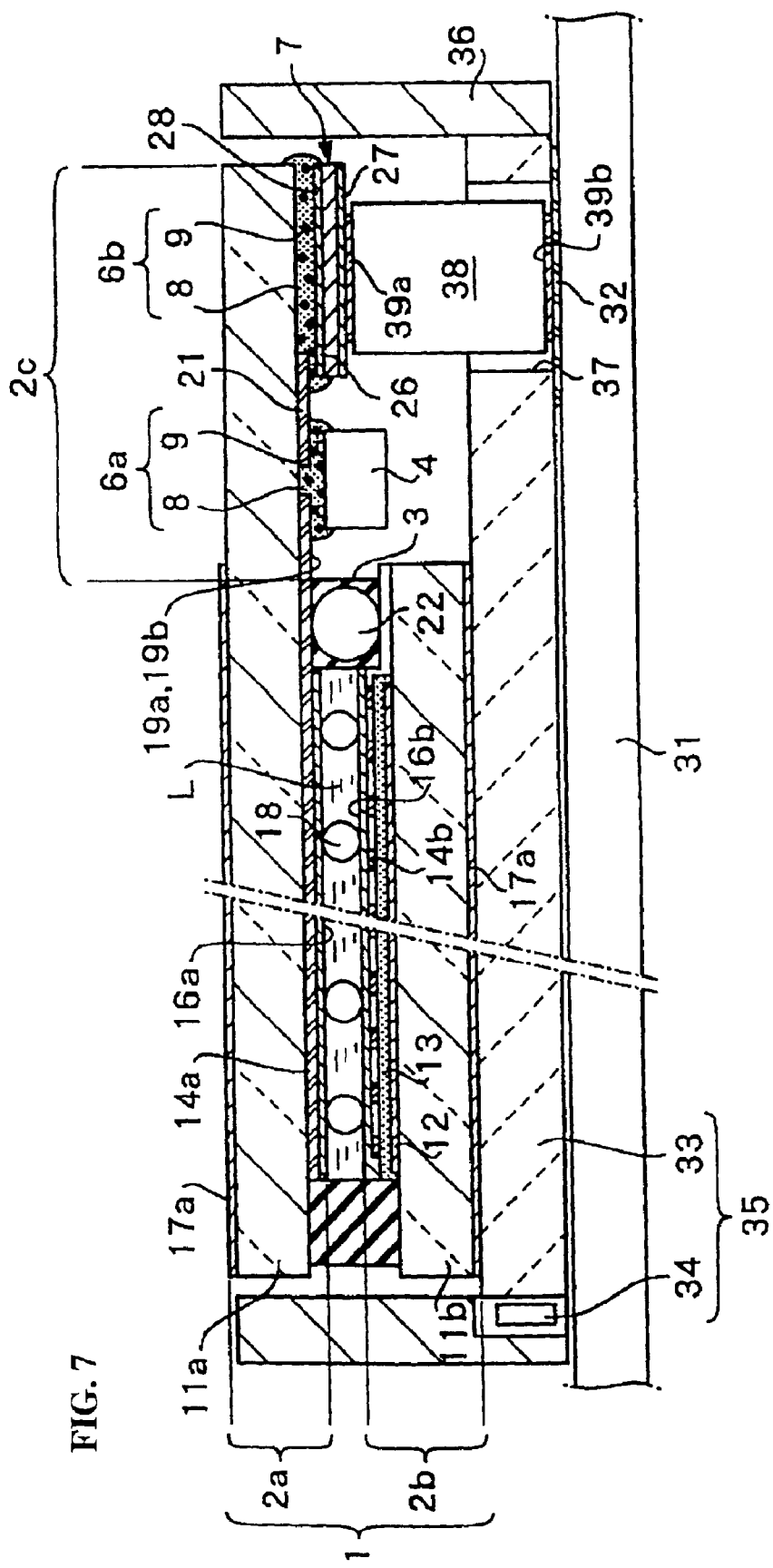
FIG. 7 is a cross-sectional view illustrating an example of the liquid-crystal device shown in FIG. 1; that is, the main portion of the electronic apparatus.

ACFs 6a and 6b are conductive polymer films employed for providing anisotropy between pairs of terminals and electrically connecting them. For example, as shown in FIG. 7, the films are formed by dispersing a large number of electrically conductive particles 9 in a thermoplastic or thermosetting resin film 8. A pair of substrates, which are the object of connection and are provided with respective terminals, are thermocompressed together sandwiching the ACFs 6a and 6b, and these substrates are adhesively bonded by the resin film 8. Moreover, the terminals formed on these substrates are electrically connected by the electrically conductive particles 9.

As shown in FIG. 7, the first substrate 2a has a base material 11a, first electrodes 14a provided on the inner surface of the base material 11a, and an alignment film 16a provided thereon. Furthermore, a polarization plate 17a is attached, with, for example, an adhesive to the outer surface of base material 11a.

The first electrodes 14a act as either scanning electrodes or signal electrodes.

Furthermore, the second substrate 2b has a base material 11b. A semitransparent reflective film 12 is provided on the inner surface of the base material 11b and an insulating film 13 is provided thereon. Second electrodes 14b are provided on the insulating film and an alignment film 16a is provided on the second electrodes. Furthermore, a polarization plate 17b is attached, with, for example, an adhesive to the outer surface of base material 11b. The second electrodes 14b act as either scanning electrodes or signal electrodes.

The first substrate 2a and the second substrate 2b are adhesively bonded on the periphery thereof with the sealing material 3. Multiple spacers 18 are dispersed on the inner surface of the first substrate 2a or the second substrate 2b, and these spacers 18 maintain a constant dimension for the gap between the substrates; that is, a cell gap in the plane surface region. An opening 3a (see FIG. 1) for liquid crystal injection is formed in a portion of sealing material 3. Liquid crystals L, for example, STN (Super Twisted Nematic) liquid crystals are injected into the cell gap through the opening 3a, and the opening 3a for liquid crystal injection is sealed with a resin or the like upon completion of the injection.

Other optical elements, such as a light diffusion plate for obtaining planar uniformity by diffusing the light entering the liquid crystal L or leaving the liquid crystal L, an overcoat layer laminated on the electrodes 14a, 14b to smooth the surface, color filters provided for color display implementation, a phase-difference plate for improving the viewing characteristics or achromatization by remodulating the polarization characteristics of the light that passed through the liquid crystal L, and the like can be provided on the interior or exterior surface of both the first substrate 2a and the second substrate 2b, or of only one of the substrates.

The base materials 11a and 11b are formed in a specified shape, for example, a rectangular or square plate shape, from, for example, a hard transparent material such as glass or a flexible transparent material such as plastics. Furthermore, the semitransparent reflective film 12 is formed from a metal material such as Al (aluminum), and either the film thickness is decreased or an aperture for transmitting the light is formed, to provide semitransparent reflection.

Furthermore, the first electrodes 14a and second electrodes 14b are formed, for example, from ITO (Indium Tin Oxide), which is a metal oxide. Moreover, the alignment films 16a and 16b are formed, for example, from a polyimide resin. These alignment films 16a and 16b are subjected to alignment treatment such as rubbing and the like, and the alignment of the liquid crystal molecules on the substrate surface is defined by such alignment treatment.

Figure 2:
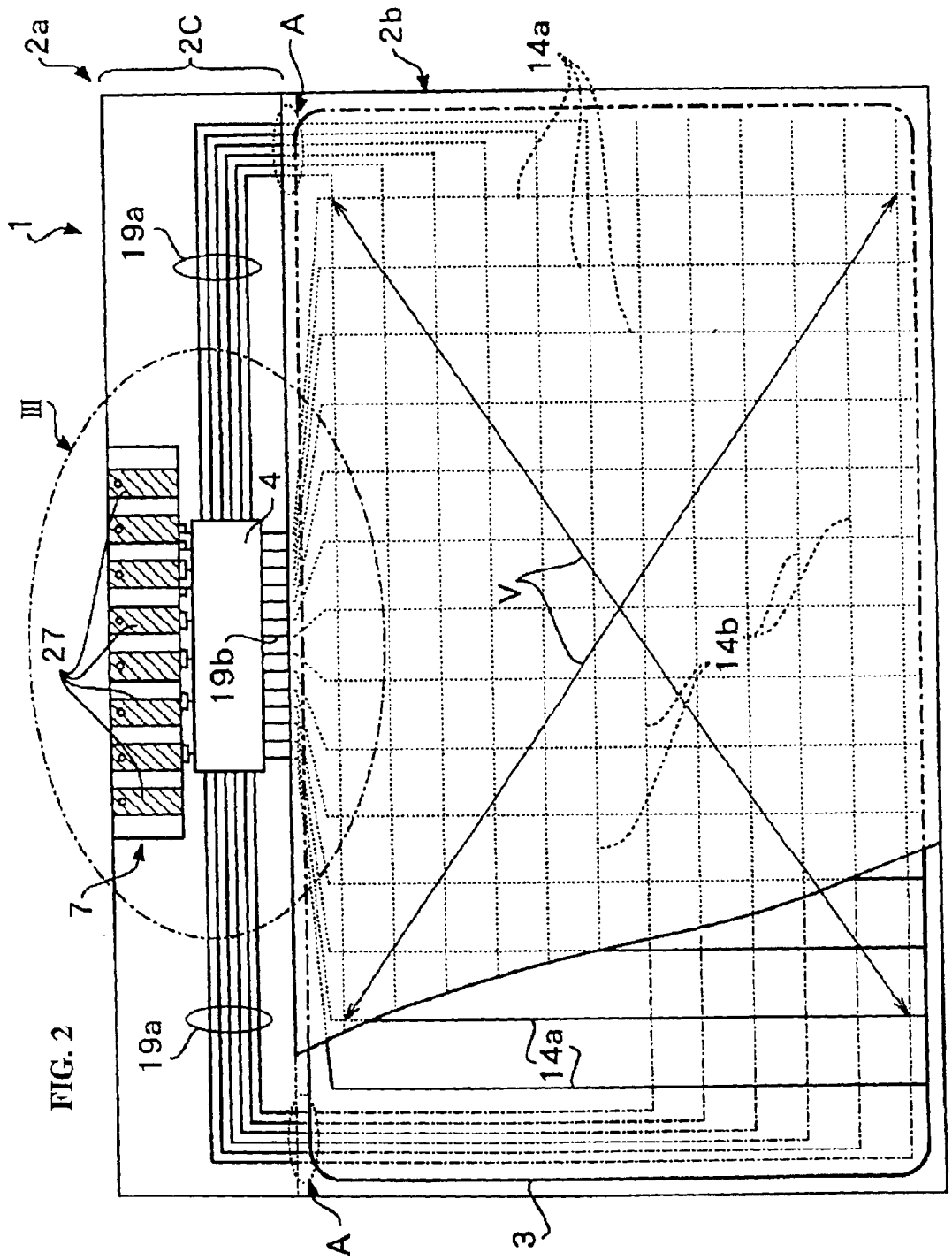
FIG. 2 is a partly exploded plan view illustrating the planar structure of the liquid-crystal device shown in FIG. 1.

FIG. 2 shows a plan structure of the liquid-crystal device 1 shown in FIG. 1. In the figure, the first electrodes 14a are formed to have a so-called stripe-like shape by arranging multiple linear patterns parallel to each other. The second electrodes 14b are also formed to have a stripe-like shape by arranging multiple linear patterns so that they cross the aforementioned first electrodes 14a. Multiple dots formed where these electrodes 14a and electrodes 14b intersect in a dot matrix fashion, with the liquid crystal layer being therebetween, form pixels for displaying an image. The region, which is partitioned and formed by the multiple pixels, serves as a display region for displaying images such as letters and numerals.

Furthermore, in FIG. 2, the first electrodes 14a and second electrodes 14b are represented with a spacing therebetween that is larger than actual size to facilitate understanding. In reality, a large number of these electrodes are formed with an extremely narrow spacing between them.

Figure 3:
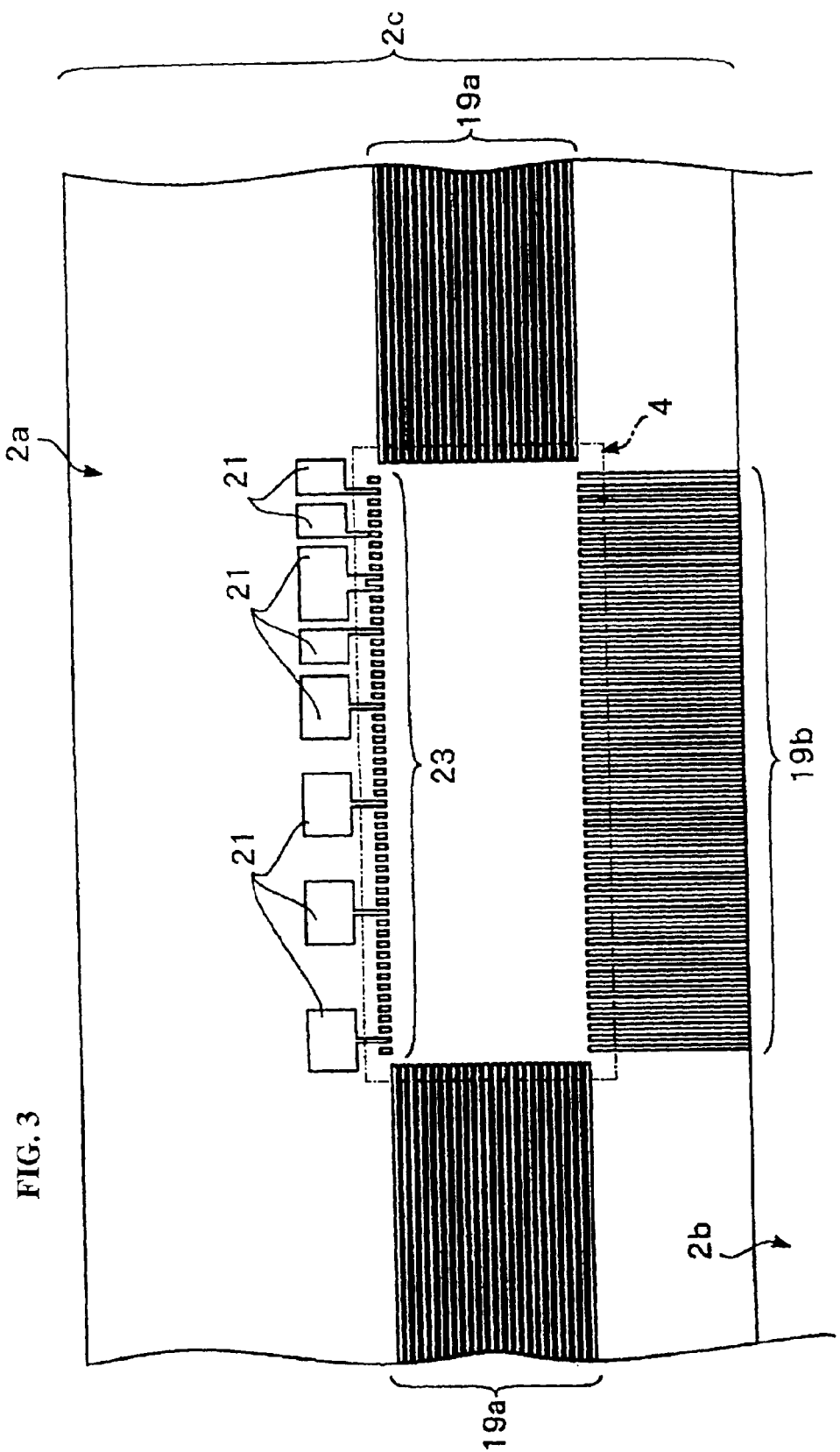
FIG. 3 is an expanded plan view illustrating a wiring pattern in the portion indicated by arrow III in FIG. 2.

FIG. 3 shows a wiring pattern formed on the portion of the substrate overhang 2c where the IC4 for liquid crystal drive and wiring substrate 7 are mounted as shown in FIG. 2. On the substrate overhang 2c, as shown in FIG. 3, wirings 19a are provided along both short sides of the IC4 for liquid crystal drive, wirings 19b are provided along the long side of the IC4 for liquid crystal drive on the liquid crystal side, and substrate terminals 21 are provided along the long side of the IC4 for liquid crystal drive on the outer side.

In FIG. 2, the wirings 19b extend directly from the first electrodes 14a located on the first substrate 2a. Furthermore, the wirings 19a are connected to the second electrodes 14b formed on the second substrate 2b shown in FIG. 2 via an electrically conductive material 22 (see FIG. 7) dispersed in the sealing material 3 in the upper and lower conductive regions shown by symbol A. In other words, in the present embodiment, the wirings 19a and wirings 19b are connected to the output bumps of IC4 for liquid crystal drive.

In FIG. 3, the substrate terminals 21 extend from specified terminals among the multiple terminals 23 that are in contact with multiple input bumps containing dummy bumps of IC4 for liquid crystal drive. In the present embodiment, the terminals 23 that are not connected to the substrate terminals 21 are the terminals that do not participate in voltage application, that is, the dummy terminals. The wirings 19a, wirings 19b, terminals 23, and substrate terminals 21 formed on the substrate overhang 2c are all formed at the same time by the same patterning method when the first electrodes 14a are formed from ITO on the first substrate 2a shown in FIG. 2. In other words, the wirings 19a, wirings 19b, terminals 23, and substrate terminals 21 are also formed from ITO, which is a metal oxide.

Figure 11:
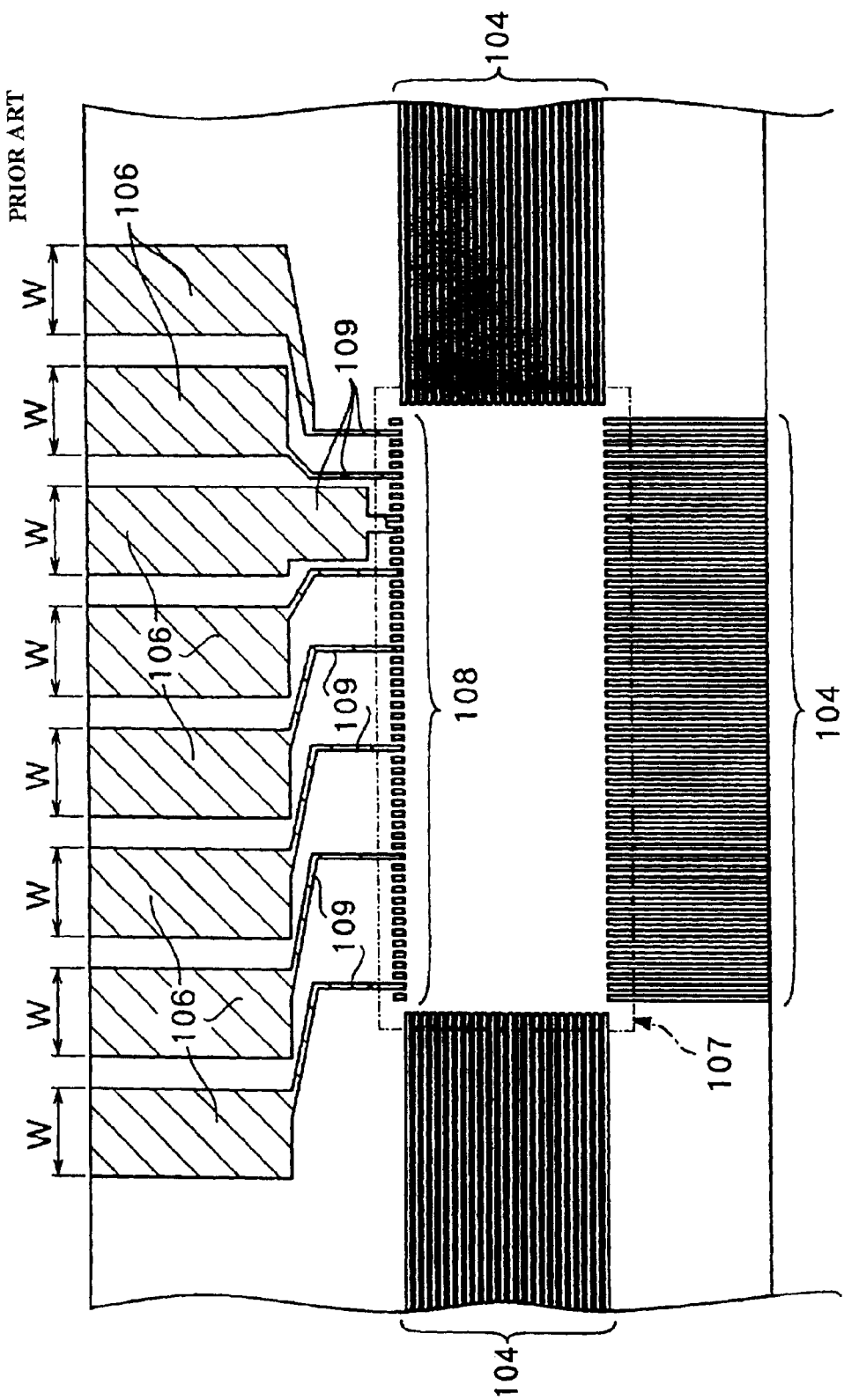
FIG. 11 is an expanded view of the main portion of the conventional device shown in FIG. 10.

In the conventional substrate terminal structure shown in FIG. 11, terminals 106 extending from multiple terminals 108, which were in contact with the bumps of IC, extended to the peripheral end portion of the substrate and served as terminals for external connection. Therefore, a wiring pattern 109 with a fine line width was present in the intermediate portion thereof and an increase in electric resistance could not be avoided. By contrast, in the present embodiment shown in FIG. 3, the ends of substrate terminals 21 are in the intermediate portion of the substrate overhang and, therefore, electric resistance can be held to a low value.

The wiring substrate 7 shown in FIG. 1 is obtained by forming the external connection pattern shown in FIG. 4(a) and the liquid panel pattern shown by a broken line in FIG. 4(b) on the surface of the base part 24 formed from a polyimide or the like. FIG. 4(a) and FIG. 4(b) show separately the patterns formed on the front and rear surfaces of the base part 24. FIG. 4(b) represents a state in which the representation of the second terminals 27 in FIG. 4(a) is omitted.

As shown in FIG. 4(b), the first electrodes 26, which are in contact with substrate terminals 21 formed on the substrate overhang 2c shown in FIG. 2, are formed on the surface of the wiring substrate 7 on the liquid-crystal panel side. Furthermore, as shown in FIG. 4(a), the second terminals 27 connected to the external circuit are formed on the surface of the wiring substrate 7 on the external connection side. A wiring pattern 28 connecting the first terminals 26 and second terminals 27 is formed on the surface of the wiring substrate 7 on the liquid-crystal panel side.

The first terminals 26, second terminals 27, and wiring pattern 28 are formed, as shown in FIG. 4(c), by forming a first layer 29a from Cu on the surface of base part 24 by using photolithography, then forming on top thereof a second layer 29b from Ni by means of plating, and further forming on top thereof a third layer 29c from Au by means of plating. Electric connection between the front and rear surfaces is provided via throughholes 29.

As shown in FIG. 1, the wiring substrate 7 is mounted in a specified position on the substrate overhang 2c by ACF 6b in a state in which the side surface of the liquid-crystal panel shown in FIG. 4(b) faces the substrate overhang 2c. The mounting of the wiring substrate 7 may be conducted prior to the mounting of the IC4 for liquid crystal drive using ACF 6a, or after the IC4 for liquid crystal drive has been mounted.

Figure 5:
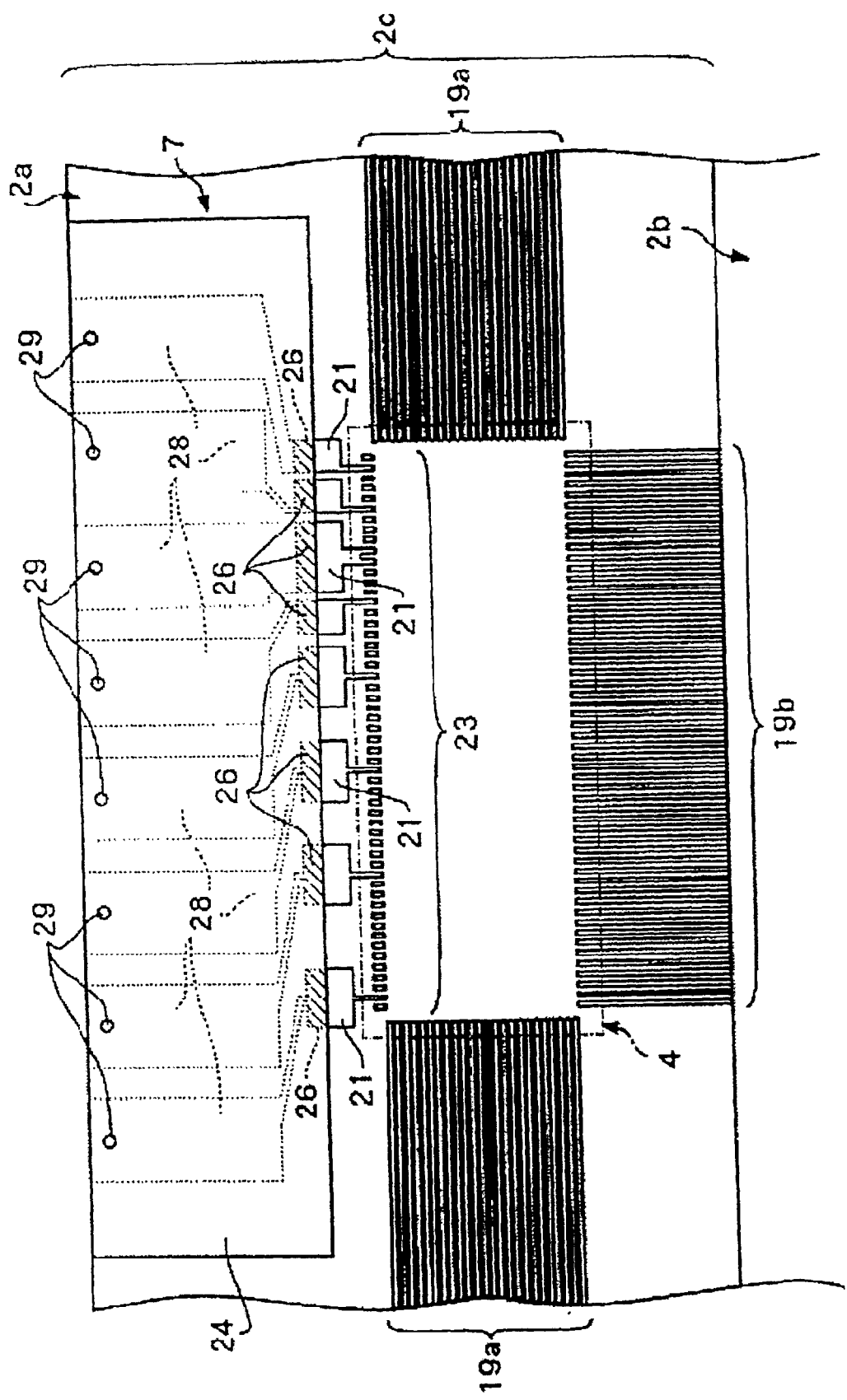
FIG. 5 is a plan view illustrating the contact state of the terminal in a case where the wiring substrate shown in FIG. 4 is mounted on the planar structure shown in FIG. 3.

FIG. 5 illustrates a state in which the wiring substrate 7 has thus been mounted in the specified position on the substrate overhang 2c. In this state, the substrate terminals 21 (see FIG. 3) located on the substrate overhang 2c and the first terminals 26 located on the wiring substrate 7 contact each other in the contact region shown by hatching in FIG. 5.

In order to facilitate understanding of the contact state between the wiring substrate 7 and the substrate overhang 2c, the representation of the wiring pattern on the external connection side of wiring substrate 7 shown in FIG. 4(a) has been omitted in FIG. 5. The wiring pattern on the external connection side is shown in FIG. 6.

Figure 6:
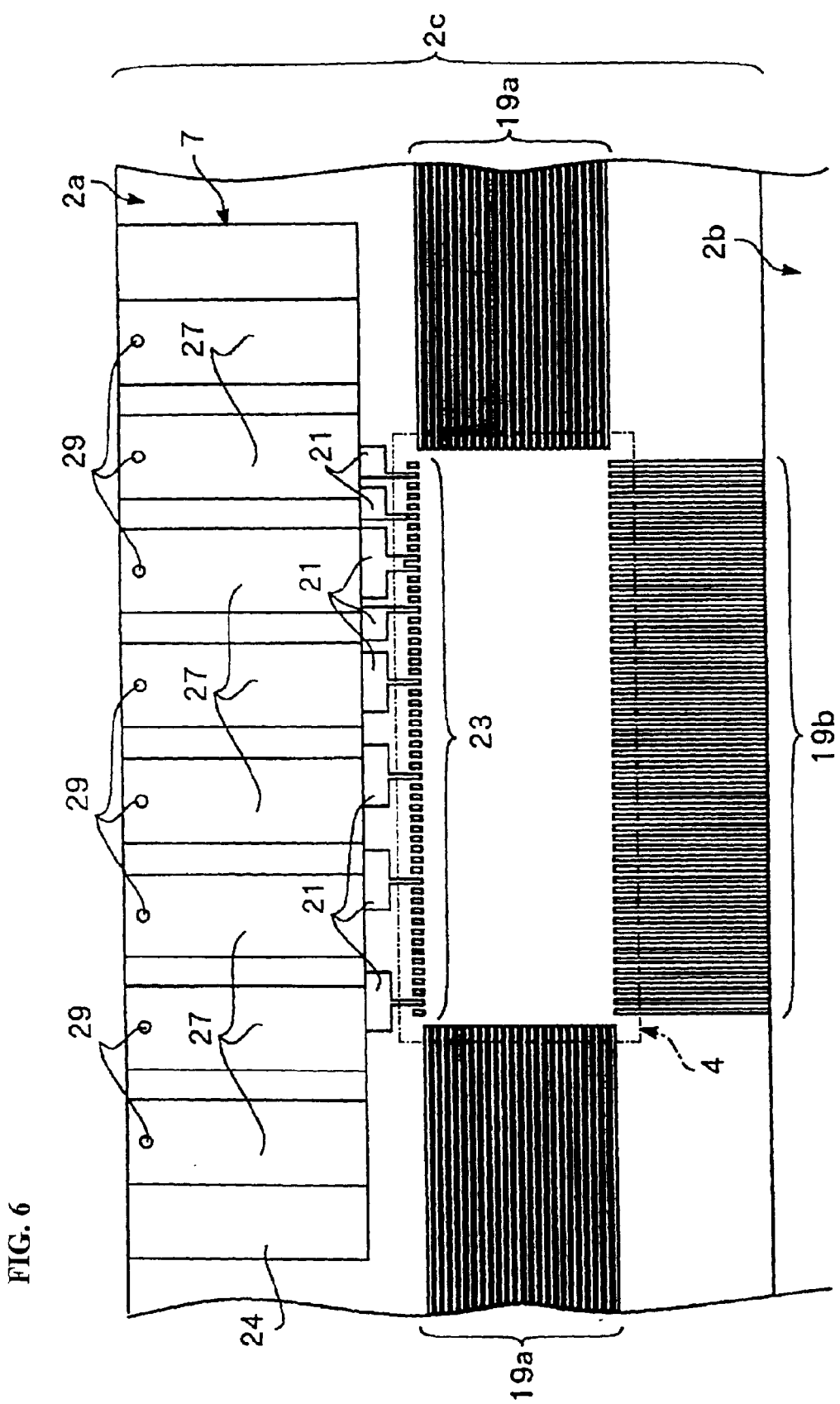
FIG. 6 is a plan view illustrating a state in which the surface wiring pattern of the wiring substrate is written, this state relating to the same portion as the planar structure shown in FIG. 5.

FIG. 6 clearly demonstrates that the second terminals 27 connected to the external circuit are formed to be much longer, that is, wider than the first terminals 26 formed on the rear side thereof. In particular, in the present embodiment, the second terminals 27 are formed such that their length spans the entire range of the wiring substrate 7 in the widthwise direction.

In the liquid-crystal device 1 shown in FIG. 1, an external circuit is connected to the second terminals 27 of the wiring substrate 7 via an electrically connecting element, for example, a rubber connector, a spring connector, or the like. A drive voltage and image data signals are supplied to the IC4 for liquid crystal drive from this external circuit. When electric connection is established by bringing the metal terminals of the rubber connector in contact with the second terminals 27, significant variations caused by component dimensional defects or assembly errors can be assumed for the contact position of the metal terminals of the rubber connector on the second terminals 27. However, if the second terminals 27 are formed to be as wide as the entire wiring substrate 7 as in the present embodiment, then stable contact between the metal terminals and the second terminals 27 can be guaranteed, even when the contact position of the metal terminals of the rubber connector is shifted.

As described above, in the present embodiment, the wiring pattern 28, connecting the second terminals 27 which are connected to the external circuit to the substrate terminals 21 formed from ITO on the substrate overhang 2c, is formed from Cu which has a low electric resistance, rather than from ITO which has a high electric resistance. Therefore, an increase in the electric resistance of the wiring pattern 28 can be reliably prevented even when the wiring density of the wiring pattern 28 is increased and the line width of wiring pattern 28 is decreased.

The possibility of holding the electric resistance of the wiring pattern 28 to a low value means that the wiring resistance on the substrate overhang 2c can be held to a low value. For this reason, in the liquid-crystal device 1 of the present embodiment, decreases in display quality, such as a cobwebbing effect on the display screen or a decrease in the density on the display screen, are eliminated.

(Second embodiment)

FIG. 7 shows the main components of an embodiment of an electronic apparatus related to the present invention. The electronic apparatus under consideration may be a cellular phone, a portable electronic terminal, or any other electronic apparatus. In FIG. 7, only a circuit substrate 31 and a terminal 32 provided thereon are shown as the components of the electronic apparatus. This circuit substrate 31 carries a control circuit which is necessary for driving the liquid-crystal device 1 and a control circuit which is necessary for driving the electronic apparatus.

In this configuration, the liquid-crystal device 1 having the structure shown in FIG. 1 and FIG. 2 can be used. In this case, the liquid-crystal device 1 can be fitted into a frame 36, as shown in FIG. 7. An illumination device 35, comprising a light guide 33 and a light source 34, is assembled into the frame 36, and the liquid-crystal device 1 is fitted into the frame so that the second substrate 2b faces the light guide 33.

An opening 37 is provided in the frame 36 in the portion located opposite the substrate overhang 2c of liquid-crystal device 1. A rubber connector 38 serving as an electric connecting element is inserted into this opening 37.

One terminal 39a (the upper terminal in the figure) of the inserted rubber connector 38 is in contact with the second terminals 27 of the wiring substrate 7 mounted on the substrate overhang 2c. When the frame 36 supporting the liquid-crystal device 1 is attached in the specified attachment position inside the electronic apparatus, the other terminal 39b (the lower terminal in the figure) of the rubber connector 38 contacts the terminals 32 of circuit substrate 31 located on the electronic apparatus. The electric system of the electronic apparatus and the electric system of the liquid-crystal device 1 are thus electrically connected via the rubber connector 38 and wiring substrate 7.

(Third embodiment)

Figure 8:
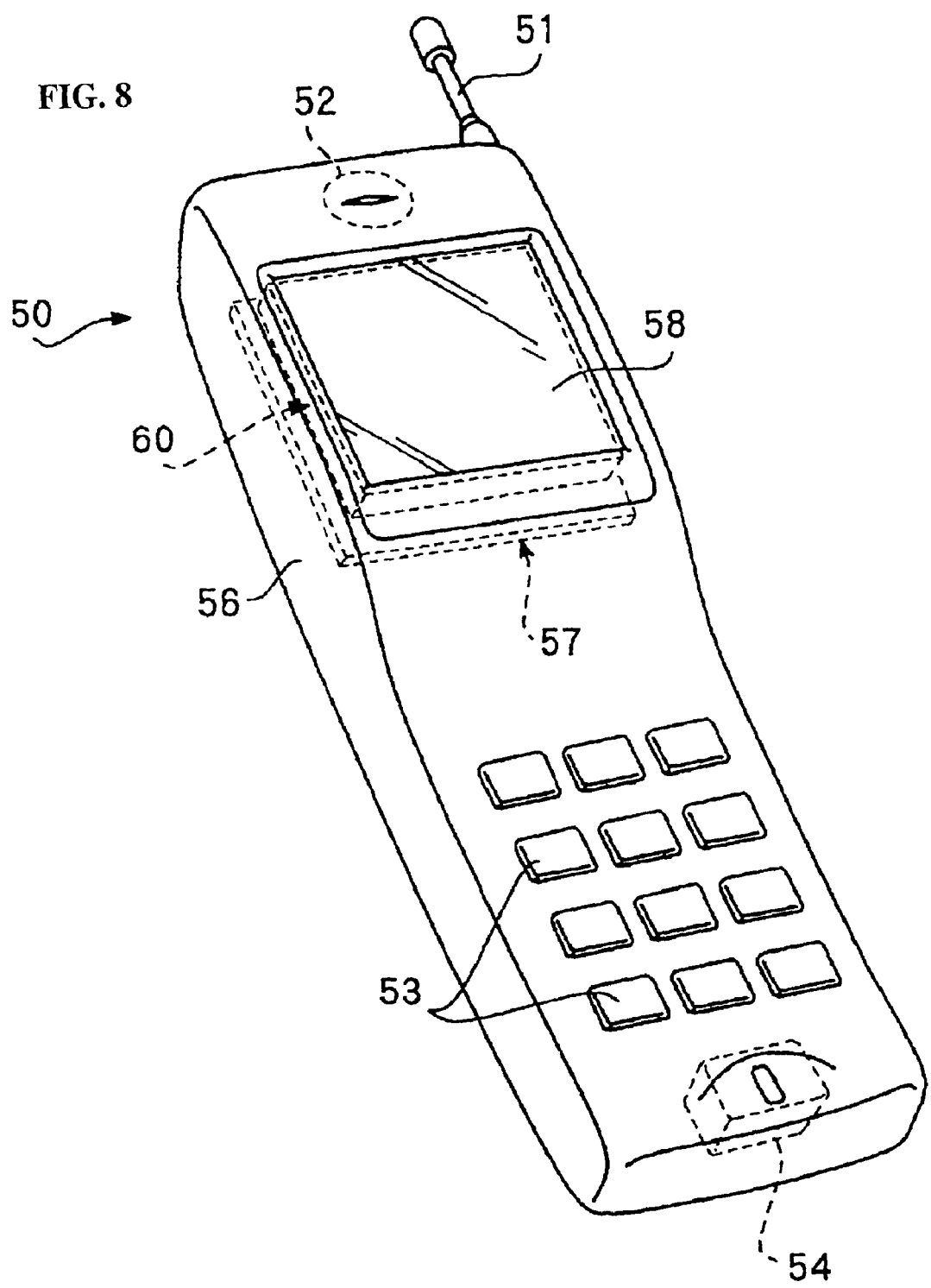
FIG. 8 is a perspective view illustrating a cellular phone, which is an embodiment of the electronic apparatus related to the present invention.

FIG. 8 shows a cellular phone, which is an embodiment of the electronic apparatus related to the present invention. The cellular phone 50 shown here is composed by enclosing a variety of structural components such as an antenna 51, a speaker 52, a key switch 53, a microphone 54, and the like in an outer case 56. A liquid-crystal device 60 serving as a display device and a control circuit substrate 57 are contained inside the outer case 56.

The upper surface of the liquid-display device 60 in the figure becomes the display surface. A transparent cover 58 designed to protect the liquid-crystal device and also to guarantee the view field of the display surface is provided in the portion of the outer case 56 opposite to the display surface. The liquid-crystal display 60 is composed, for example, of the liquid-crystal device 1 shown in FIG. 1. The liquid-crystal device 1 can be additionally provided with the illumination apparatus shown in FIG. 7 and supported with a frame 36. Furthermore, the control circuit substrate 57 shown in FIG. 8 can be composed of the circuit substrate 31 shown in FIG. 7.

In the cellular phone 50 shown in FIG. 8, a signal that is input via the key switch 53 and microphone 54 or the received data that were received by the antenna 51 is input into the control circuit of the control circuit substrate 57. The control circuit displays an image such as numerals, letters, drawings, and the like in the display surface of the liquid-crystal device 60 based on the various input data, and the transmission data are transmitted from the antenna 51.

Figure 9:
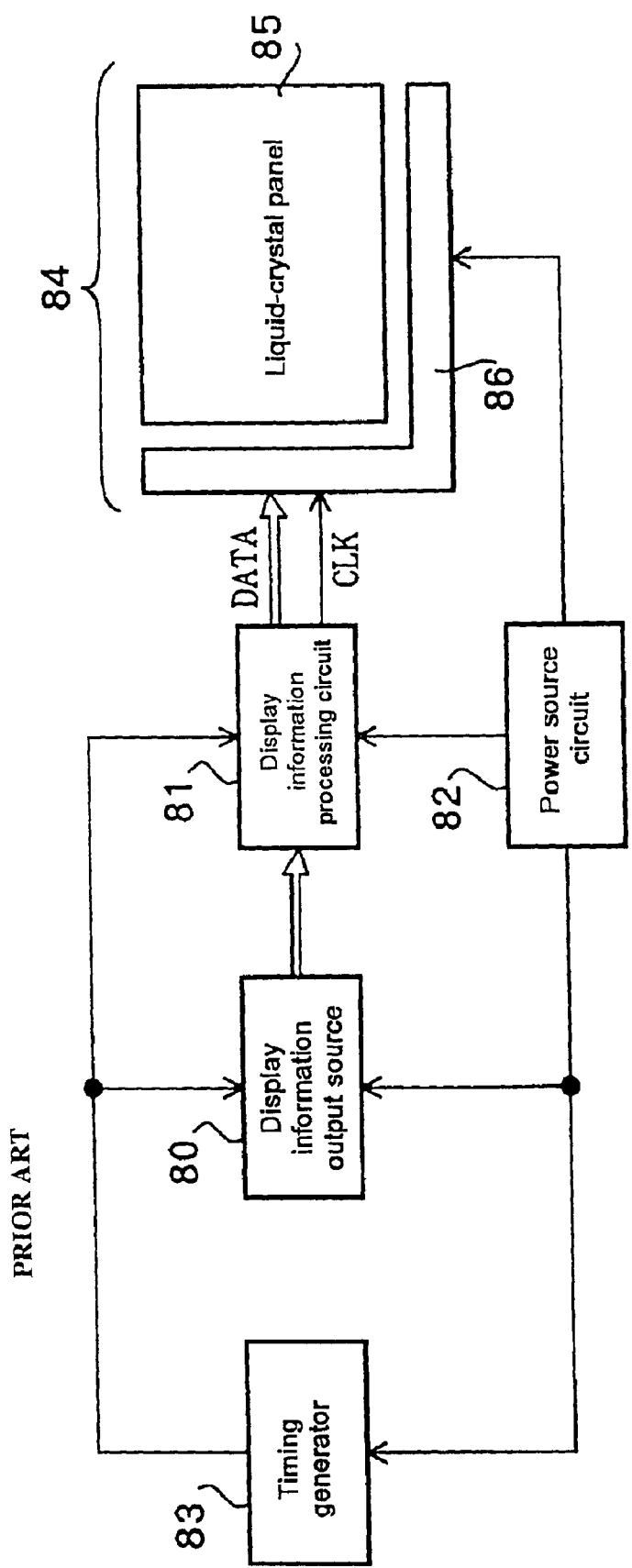
FIG. 9 is a block diagram illustrating an example of the electric control system used in the electronic apparatus shown in FIG. 8 or another electronic apparatus.
Figure 10:
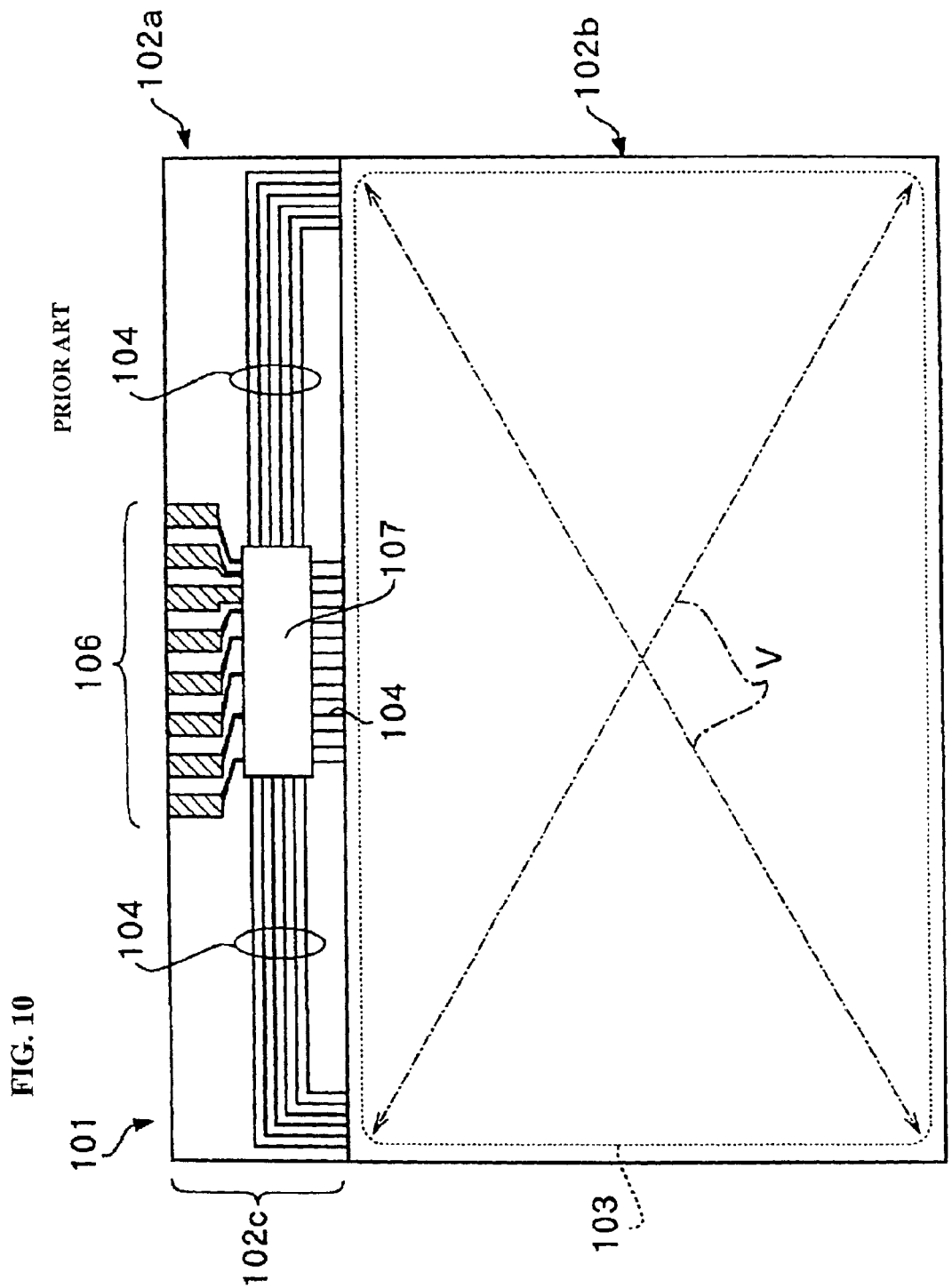
FIG. 10 is a plan view illustrating an example of the conventional liquid-crystal device.

FIG. 9 illustrates an embodiment of an electric control system used in the cellular phone shown in FIG. 8 or in the other electronic apparatus. The electric control system shown herein comprises a display information output source 80, a display information processing circuit 81, a power supply circuit 82, a timing generator 83, and a liquid-crystal device 84 serving as a display device. Furthermore, the liquid-crystal device 84 comprises a liquid-crystal panel 85 and a drive circuit 86. The liquid-crystal device 84 can be composed, for example, using the liquid-crystal device 1 shown in FIG. 1. In this case, the liquid-crystal panel 85 has a configuration obtained by removing the IC4 for liquid crystal drive from the liquid-crystal device 1 shown in FIG. 1.

The display information output source 80 comprises memory such as ROM (Read Only Memory), RAM (Random Access Memory) or the like, a storage unit such as a disk of any type, a synchronization circuit for synchronizing and outputting the digital image signals, and the like; and supplies display information such as image signals in a specified format to the display information processing circuit 81 based on the clock signals generated by the timing generator 83.

The display information processing circuit 81 comprises a variety of well-known circuits, such as a serial-parallel conversion circuit, an amplification-inversion circuit, a rotation circuit, a gamma correction circuit, a clamp circuit, and the like; executes the processing of the input display information; and supplies the image signals to the drive circuit 86 together with the clock signal CLK. The drive circuit 86 is composed of a scanning line drive circuit, a data line drive circuit, a detection circuit, and the like. Furthermore, the power supply circuit 82 supplies a specified voltage to various structural elements.

In the electronic apparatus of the present embodiment, the electric connection structure between the control circuit substrate 57 and the liquid-crystal device 60 can have the structure shown in FIG. 7. Furthermore, the liquid-crystal device 1 can be composed of the liquid-crystal device 1 shown in FIG. 1 and FIG. 2.

(Other Embodiments)

The present invention was described above based on the preferred embodiments. However, the present invention is not limited to these embodiments and various modifications can be made within the scope of the present invention as defined in the claims.

For example, in the embodiment illustrated by FIG. 1, the present invention was applied to a simple matrix liquid-crystal device. However, the present invention can also be applied to active matrix liquid-crystal devices possessing a structure in which two-terminal switching elements such as TFDs (Thin Film Diodes) are used as active elements or to active matrix liquid-crystal devices possessing a structure in which three-terminal switching elements such as TFTs (Thin Film Transistors) are used as active elements.

Furthermore, in the embodiment illustrated by FIG. 1, a wiring substrate 7 was provided on the input bump side of IC4 for liquid crystal drive. However, the present invention can also be applied to liquid-crystal devices possessing a structure in which no IC4 for liquid crystal drive is mounted on the substrate overhang 2c, if it is necessary to pattern a wiring with a high wiring density on the substrate overhang 2c.

Moreover, in the embodiments illustrated by FIG. 1 and FIG. 4, the first terminals 26 that contact the substrate are formed on one surface, either front or rear, of the wiring substrate 7, and the second terminals 27 that contact the external components are formed on the other side. However, both the first and second terminals can be formed instead on one surface, either front or rear. In this case, the second terminals that contact the terminals of the external circuit must be formed in the region of the wiring substrate 7 which projects to the outside of the substrate.

The electronic device related to the present invention is not limited to the cellular phone shown in FIG. 8 and can include any other electronic apparatus, for example, portable information terminals, digital cameras, and the like.

As described above, with the substrate terminal structure related to the present invention, a wiring pattern, connecting the second terminals that are connected to the external circuit to the substrate terminals formed from a metal oxide film on the substrate, is formed by a wiring pattern with a low electric resistance located on the wiring substrate, rather than by a metal oxide film. Therefore, an increase in the electric resistance of the wiring pattern can be prevented even when the wiring density of the wiring pattern is increased and the line width of the wiring pattern is decreased.

Furthermore, with the liquid-crystal device and electronic apparatus related to the present invention, the electric resistance of the wiring pattern contained therein can be held to a low value. Therefore, decreases in display quality, such as a cobwebbing effect on the display screen or a decrease in the density on the display screen, are eliminated.

The entire disclosure of Japanese Patent Application No. 2001-072268 filed Mar. 14, 2001 is incorporated by reference herein.

What is claimed is:

1. A substrate terminal structure comprising:
    a substrate;
    substrate terminals formed on the substrate by a metal oxide film; and
    a wiring substrate adhesively bonded to the substrate;
    wherein the wiring substrate includes:
        first terminals connected to the substrate terminals;
        a continuous wiring pattern directly extending from said first terminals; and
        second terminals directly connected to said wiring pattern, said second terminals being electrically connected to an electrically conductive connecting element;
    wherein the electrically conductive connecting element is one of a rubber connector and a spring connector; and
    wherein the wiring pattern has an electric resistance lower than that of the metal oxide film.

2. The substrate terminal structure according to claim 1, wherein the first and second terminals are formed from the same material as the wiring pattern.

3. The substrate terminal structure according to claim 1, wherein the wiring pattern is formed from a material containing copper.

4. The substrate terminal structure according to claim 1, wherein the wiring substrate further comprises a two-surface wiring substrate having a wiring pattern on both surfaces thereof, the first terminals are formed on one side of said two-surface wiring substrate, and the second terminals are formed on the opposite surface of said two-surface wiring substrate.

5. The substrate terminal structure according to claim 4, wherein the second terminals are longer than the first terminals.

6. A liquid-crystal device comprising:
    a pair of substrates sandwiching a liquid crystal;
    substrate terminals formed from a metal oxide film on a substrate overhang which projects from at least one of said substrates outside of the other substrate; and
    a wiring substrate adhesively bonded to the substrate overhang;
    wherein the wiring substrate includes:
        first terminals connected to the substrate terminals;
        a continuous wiring pattern directly extending from said first terminals; and
        second terminals directly connected to said wiring pattern, said second terminals being electrically connected to an electrically conductive connecting element;
    wherein the electrically conductive connecting element is one of a rubber connector and a spring connector; and wherein the wiring pattern has an electric resistance lower than that of the metal oxide film.

7. The liquid-crystal, device of claim 6, wherein a width of the second terminals is wider than a width of the substrate terminals oxide film.

8. A liquid-crystal device comprising:
a pair of substrates sandwiching liquid crystals;
an electronic component mounted on a substrate overhang which projects from at least one of said substrates outside of the other substrate;
substrate terminals provided on the substrate overhang connected to the terminals of the electronic component and formed by a metal oxide; and
a wiring substrate adhesively bonded to the substrate overhang;
wherein the wiring substrate includes:
first terminals connected to the substrate terminals;
a continuous wiring pattern directly extending from said first terminal; and
a second terminal directly connected to said wiring pattern, said second terminal being electrically connected to an electrically conductive connecting element;
wherein the electrically conductive connecting element is one of a rubber connector and a spring connector; and
wherein the wiring pattern has an electric resistance lower than that of the metal oxide film.

9. The liquid-crystal device according to claim 8, wherein a width of the second terminals is wider than a width of the substrate terminals.

10. The liquid-crystal device according to claim 8, wherein the electronic component further comprises an IC chip and the wiring substrate is provided on an input terminal side of said IC chip.

11. The liquid-crystal device according to claim 8, wherein the first and second terminals are formed from the same material as the wiring pattern.

12. The liquid-crystal device according to claim 8, wherein the wiring pattern is formed from a material containing copper.

13. The liquid-crystal device according to claim 8, wherein the wiring substrate further comprises a two-surface wiring substrate having a wiring pattern on both surfaces thereof, the first terminals are formed on one side of said two-surface wiring substrate, and the second terminals are formed on the opposite surface of said two-surface wiring substrate.

14. The liquid-crystal device according to claim 13, wherein the second terminals are longer than the first terminals.

15. An electronic apparatus comprising:
a liquid-crystal device;
a circuit substrate; and
an electrically conductive connecting element which electrically connects the liquid-crystal device to the circuit substrate;
wherein the liquid-crystal device includes:
a pair of substrates sandwiching liquid crystals;
substrate terminals formed from a metal oxide film on a substrate overhang which projects from at least one of said substrates outside of the other substrate; and
a wiring substrate adhesively bonded to the substrate overhang;
wherein the wiring substrate includes:
first terminals connected to the substrate terminals;
a continuous wiring pattern directly extending from said first terminals; and
second terminals directly connected to said wiring pattern;
wherein the wiring pattern has an electric resistance lower than that of the metal oxide film; and
wherein the electrically conductive connecting element electrically connects the second terminals located on the wiring substrate to the circuit substrate, and the electrically conductive connecting element is one of a rubber connector and a spring connector.

16. An electronic apparatus comprising:
a liquid-crystal device;
a circuit substrate; and
an electrically conductive connecting element which electrically connects the liquid-crystal device to the circuit substrate;
wherein the liquid-crystal device includes:
a pair of substrates sandwiching liquid crystals;
an electronic component mounted on a substrate overhang which projects from at least one of said substrates outside of the other substrate;
substrate terminals provided on the substrate overhang connected to the terminals of the electronic component and formed from a metal oxide; and
a wiring substrate adhesively bonded to the substrate overhang;
wherein the wiring substrate includes:
first terminals connected to the substrate terminals;
a continuous wiring pattern directly extending from said first terminals; and
second terminals directly connected to said wiring pattern;
wherein the wiring pattern has an electric resistance lower than that of the metal oxide film; and
wherein the electrically conductive connecting element electrically connects the second terminals located on the wiring substrate to the circuit substrate, and the electrically conductive connecting element is one of a rubber connector and a spring connector.

17. A liquid-crystal device comprising:
a pair of substrates sandwiching a liquid crystal;
substrate terminals formed from a metal oxide film on a substrate overhang which projects from at least one of said pair of substrates outside of the other of said pair of substrates; and
a wiring substrate entirely within and adhesively bonded to a boundary of the substrate overhang;
wherein the wiring substrate includes:
first terminals connected to the substrate terminals;
a continuous wiring pattern directly extending from said first terminals;
second terminals directly connected to said wiring pattern, said second terminals being electrically connected to an electrically conductive connecting element that is one of a rubber connector and a spring connector; and
wherein the wiring pattern has an electrical resistance lower that that of the metal oxide film.

18. A liquid crystal device comprising:
a pair of substrates sandwiching liquid crystals;
an electronic component mounted on a substrate overhang which projects from at least one of said pair of substrates outside of the other of said pair of substrates;

substrate terminals provided on the substrate overhang connected to terminals of the electronic component and formed by a metal oxide; and a wiring substrate adhesively bonded within a boundary of the substrate overhang;

wherein the wiring substrate includes:

first terminals connected to the substrate terminals;

a continuous wiring pattern directly extending from said first terminals;

a second terminal directly connected to said wiring pattern, said second terminals being electrically connected to an electrically conductive connecting element that is one of a rubber connector and a spring connector; and wherein the wiring pattern has an electric resistance lower than that of the metal oxide film.

* * * * *

UNITED STATES PATENT AND TRADEMARK OFFICE
CERTIFICATE OF CORRECTION

PATENT NO. : 6,897,933 B2
DATED : April 12, 2005
INVENTOR(S) : Joshua J. Coon

It is certified that error appears in the above-identified patent and that said Letters Patent is hereby corrected as shown below:

Column 5,
Line 9, "3 dimensional" should read -- 3-dimensional --.

Column 6,
Line 44, "atmospheric pressure: laser" should read -- atmospheric pressure laser --.
Line 55, "(110 ms = 100 Hz)" should read -- (1/10ms = 100 Hz) --.

Column 7,
Line 37, "chemical: supply houses" should read -- chemical supply houses --.

Column 9,
Line 21, "(Laiko U V, Taranenko" should read -- (Laiko VV, Taranenko --.
Line 25, "(I pulse every 10 ms)." should read -- (1 pulse every 10 ms). --.
Line 35, "consume 35 ms." should read -- consume ~ 35 ms. --.

Signed and Sealed this

Thirtieth Day of August, 2005

JON W. DUDAS
*Director of the United States Patent and Trademark Office*